United States Patent
Takizawa

(10) Patent No.: US 7,768,255 B2
(45) Date of Patent: Aug. 3, 2010

(54) INTERCONNECTION SUBSTRATE, SKEW MEASUREMENT METHOD, AND TEST APPARATUS

(75) Inventor: Shigeki Takizawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 162 days.

(21) Appl. No.: 12/199,811

(22) Filed: Aug. 28, 2008

(65) Prior Publication Data

US 2010/0052723 A1  Mar. 4, 2010

(51) Int. Cl.
G01R 31/26 (2006.01)
(52) U.S. Cl. .................................. 324/158.1
(58) Field of Classification Search .......... None
See application file for complete search history.

(56) References Cited

U.S. PATENT DOCUMENTS

| | | | | |
|---|---|---|---|---|
| 4,656,178 A * | 4/1987 | Junusov et al. | ............... | 514/279 |
| 4,724,378 A * | 2/1988 | Murray et al. | ............... | 714/738 |
| 6,448,799 B1 * | 9/2002 | Niwa | ........................... | 324/763 |
| 6,944,801 B2 * | 9/2005 | Kojima | ........................ | 714/700 |
| 7,331,005 B2 * | 2/2008 | Arnold et al. | ................ | 714/731 |
| 7,523,007 B2 * | 4/2009 | Huang et al. | .................. | 702/89 |
| 7,595,629 B2 * | 9/2009 | Miller | ....................... | 324/158.1 |

FOREIGN PATENT DOCUMENTS

| | | |
|---|---|---|
| JP | 08-062291 | 3/1996 |
| JP | 08-082655 | 3/1996 |
| JP | 2001-021620 | 1/2001 |
| JP | 2003-043124 | 2/2003 |
| JP | 2005-293808 | 10/2005 |
| JP | 2005-331264 | 12/2005 |

OTHER PUBLICATIONS

"Search Report of PCT counterpart application", issued on Dec. 1, 2009, p.1-p.9.

\* cited by examiner

*Primary Examiner*—Vinh P Nguyen
(74) *Attorney, Agent, or Firm*—Jianq Chyun IP Office

(57) ABSTRACT

There is provided an interconnection substrate used in skew adjustment between output pins in a test apparatus, the test apparatus supplying a test signal to a device under test to test the device under test, the interconnection substrate including: a first terminal coupled to a first output pin that outputs the test signal; a second terminal coupled to a second output pin that outputs the test signal; a first interconnection connecting the first terminal to a bonding node; a second interconnection connecting the second terminal to the bonding node; and a third interconnection connecting the bonding node to an output node, where the first interconnection and the second interconnection have a length equal to each other.

9 Claims, 7 Drawing Sheets

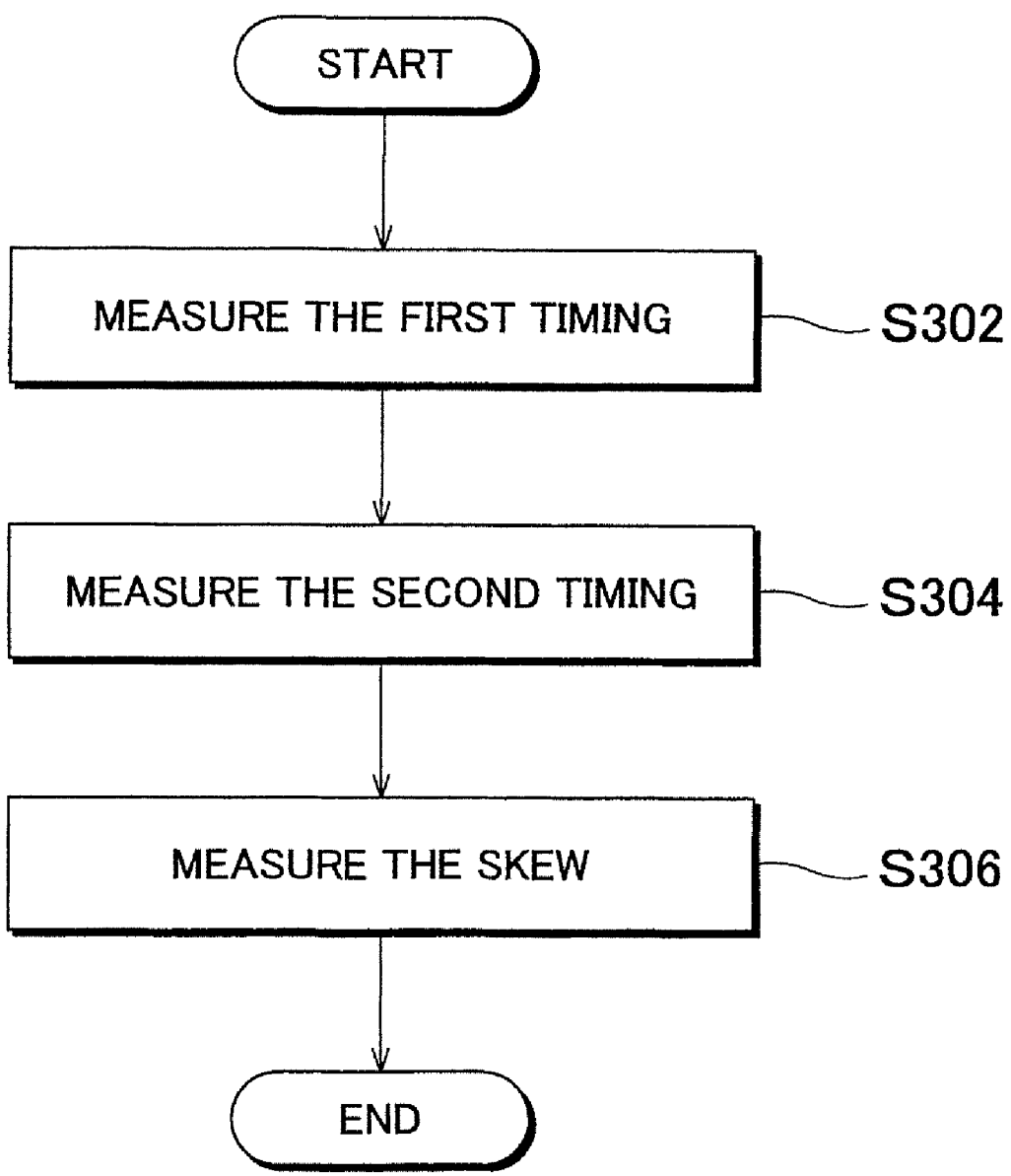
F I G . 3

INTERCONNECTION SUBSTRATE, SKEW MEASUREMENT METHOD, AND TEST APPARATUS

BACKGROUND

1. Technical Field

The present invention relates to an interconnection substrate, a skew measurement method, and a test apparatus.

2. Related Art

A test apparatus for testing a device under test such as a semiconductor device and an electronic device tests the device under test by supplying a test signal to the device under test and comparing a signal output from the device under test with a predetermined expected value signal. The test signal undergoes adjustment of phase, frequency, and the like, in the test apparatus, before being supplied to the device under test.

Japanese Patent Application Publication No. 2005-293808 discloses a test apparatus that tests a device under test that outputs a differential signal by supplying a differential signal to a differential terminal of the device under test via a differential driver. This test apparatus adjusts the skew of differential signals so that the differential signals appropriately cross each other at the differential terminal of the device under test.

Recently, as the speed of semiconductor devices increases, there has been a demand for correcting the skew between output pins in the test apparatus with high accuracy. It is also demanded that the correction of the skew is conducted in short time and inexpensively.

SUMMARY

Therefore, it is an object of an aspect of the innovations herein to provide an interconnection substrate, a skew measurement method, and a test apparatus, which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, provided is one exemplary interconnection substrate used in skew adjustment between output pins in a test apparatus, the test apparatus supplying a test signal to a device under test to test the device under test, the interconnection substrate including: a first terminal coupled to a first output pin that outputs the test signal; a second terminal coupled to a second output pin that outputs the test signal; a first interconnection connecting the first terminal to a bonding node; a second interconnection connecting the second terminal to the bonding node; and a third interconnection connecting the bonding node to an output node, where the first interconnection and the second interconnection have a length equal to each other. The length of the first interconnection and the second interconnection may the minimum.

The test apparatus may include an input terminal connected to a timing measurement circuit operable to measure a transition timing of an applied signal, and the output node is a third terminal coupled to the input terminal of the test apparatus. The interconnection substrate may further include a timing measurement circuit operable to measure a transition timing of an applied signal, where the output node is an input node of the timing measurement circuit. The test signal outputted from the first output pin may be a positive phase signal, and the test signal outputted from the second output pin is a negative phase signal.

According to the second aspect related to the innovations herein, provided is one exemplary skew measurement method for measuring a skew between output pins in a test apparatus, the test apparatus supplying a test signal to a device under test to test the device under test, the skew measurement method including: preparing an interconnection substrate that includes a first terminal, a second terminal, a first interconnection connecting the first terminal to a bonding node, a second interconnection connecting the second terminal to the bonding node and having a length equal to the first interconnection, and a third interconnection connecting the bonding node to an output node; coupling a first output pin of the test apparatus to the first terminal of the interconnection substrate, where the first output pin outputs the test signal, and coupling a second output pin of the test apparatus to the second terminal of the interconnection substrate, where the second output pin outputs the test signal; and measuring a skew between the first output pin and the second output pin by measuring a voltage of the output node relative to a reference voltage.

The measuring a skew may include: outputting the test signal from the first output pin while maintaining the second output pin to either a high level or a low level, and measuring a first timing at which the voltage of the output node matches a first reference voltage, where the first reference voltage is determined based on a relation between a level of the second output pin and a transition state of the test signal; outputting the test signal from the second output pin while maintaining the first output pin to either a high level or a low level, and measuring a second timing at which the voltage of the output node matches a second reference voltage, where the second reference voltage is determined based on a relation between a level of the first output pin and the transition state of the test signal; and measuring the skew from a difference between the first timing and the second timing.

The first output pin may output a positive phase signal of the test signal, and the second output pin outputs a negative phase signal of the test signal, and the measuring a skew may include measuring the skew using a value of a spike voltage occurring at the output node.

According to the third aspect related to the innovations herein, provided is one exemplary test apparatus for supplying a test signal to a device under test to test the device under test, the test apparatus including: a first output pin and a second output pin that output the test signal; a timing measurement circuit operable to measure a timing of an applied signal; and an interconnection substrate including: a first terminal coupled to the first output pin, a second terminal coupled to the second output pin, a first interconnection connecting the first terminal to a bonding node, a second interconnection connecting the second terminal to the bonding node and having a length equal to the first interconnection, and a third interconnection connecting the bonding node to an output node that is coupled to an input of the timing measurement circuit.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3 schematically shows the skew measurement method for measuring the skew in the test apparatus 100 shown in FIG. 2.

DESCRIPTION OF EXEMPLARY EMBODIMENTS

Figure 1:
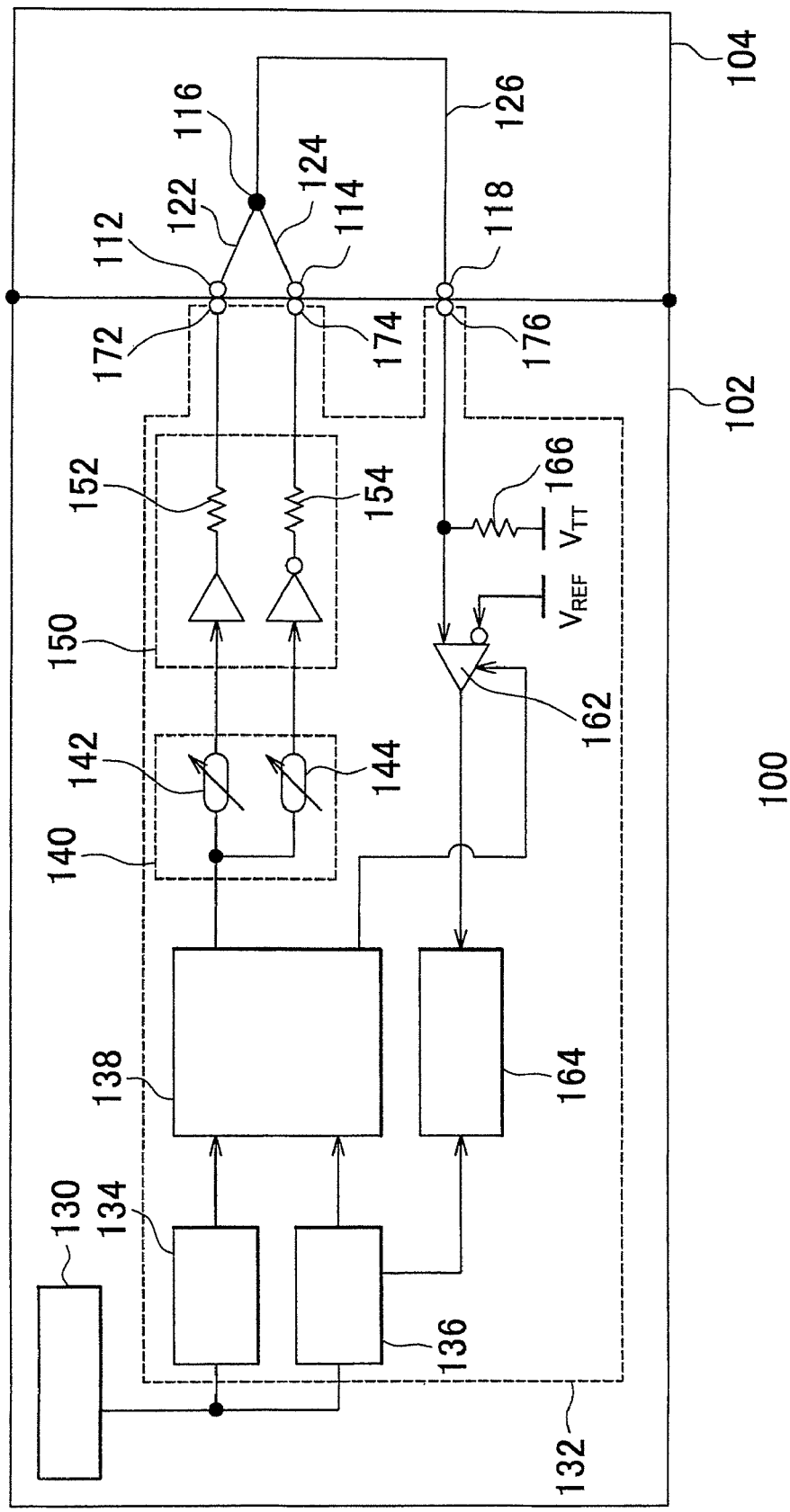
FIG. 1 schematically shows an example of the configuration of a test apparatus 100 that includes an interconnection substrate 104 according to an embodiment.

Some aspects of the invention will now be described based on the embodiments, which do not intend to limit the scope of the present invention, but exemplify the invention. All of the features and the combinations thereof described in the embodiment are not necessarily essential to the invention. The same or similar elements may occasionally be provided with the same reference numeral, with the related description thereof omitted.

FIG. 1 schematically shows an example of the configuration of a test apparatus 100 that includes an interconnection substrate 104 according to an embodiment. The test apparatus 100 includes an apparatus body 102 and an interconnection substrate 104. The apparatus body 102 tests a device under test by applying a test signal to the device under test. The interconnection substrate 104 is used to adjust the skew between output pins in the test apparatus 100.

The test apparatus 100 couples the apparatus body 102 and the device under test, to test the device under test. The test apparatus 100 couples the apparatus body 102 and the interconnection substrate 104, to adjust the skew between output pins. Note that FIG. 1 shows the state in which the apparatus body 102 is coupled to the interconnection substrate 104, and does not show the device under test.

The apparatus body 102 includes a reference clock generator 130 and a test executing section 132. The test executing section 132 includes a timing generator 134, a pattern generator 136, a waveform shaper 138, a skew adjustment section 140, a differential driver 150, a first output pin 172, and a second output pin 174. The skew adjustment section 140 includes a variable delay circuit 142 and a variable delay circuit 144. The differential driver 150 includes an output resistance 152 and an output resistance 154. The test executing section 132 includes a comparator 162, a pattern comparator 164, a termination resistance 166, and an input terminal 176.

The first output pin 172 and the second output pin 174 may be an example of an output pin. The comparator 162 may be an example of a timing measurement circuit that measures a transition timing of an applied signal. The apparatus body 102 may include a plurality of test executing sections 132. According to the configuration, even when the device under test includes a plurality of blocks under test, the test apparatus 100 is able to simultaneously test the plurality of blocks under test.

The interconnection substrate 104 includes a first terminal 112 coupled to the first output pin 172, a second terminal 114 coupled to the second output pin 174, a bonding node 116, and a third terminal 118 coupled to the input terminal 176. The third terminal 118 may be an example of an output node. The interconnection substrate 104 includes a first interconnection 122 connecting the first terminal 112 to the bonding node 116, a second interconnection 124 connecting the second terminal 114 to the bonding node 116, and a third interconnection 126 connecting the bonding node 116 to the third terminal 118.

As follows, the test operation of the test apparatus 100 to test a device under test is explained, and then skew adjustment between output pins of the test apparatus 100 is considered. Then, a skew measurement method and a skew adjustment method using the interconnection substrate 104 are explained.

First, the test operation of the test apparatus 100 to test a device under test is explained, by way of an example where the test apparatus 100 tests a device under test that outputs a differential signal. In the present embodiment, the test signal outputted from the first output pin 172 of the test apparatus 100 may be a positive phase signal, and the test signal outputted from the second output pin 174 of the test apparatus 100 may be a negative phase signal.

The reference clock generator 130 generates a reference clock of the test apparatus 100. The reference clock generator 130 supplies the reference clock to the timing generator 134 and the pattern generator 136.

The timing generator 134 generates a timing signal, and supplies the timing signal to the waveform shaper 138. The timing signal defines a timing at which a test signal supplied to the device under test is generated as a voltage signal.

The pattern generator 136 generates a pattern signal, and supplies the pattern signal to the waveform shaper 138. The pattern signal defines the test pattern of a test signal. The pattern signal may be a signal having a digital pattern. Moreover, the pattern generator 136 generates an expected value signal corresponding to the test signal, and supplies the expected value signal to the pattern comparator 164.

The waveform shaper 138 shapes the pattern signal supplied by the pattern generator 136 and the timing signal supplied by the timing generator, into a waveform suitable for testing the device under test. The waveform shaper 138 supplies the shaped waveform to the device under test via the skew adjustment section 140 and the differential driver 150. The waveform shaper 138 generates a strobe signal and supplies the strobe signal to the comparator 162. The strobe signal is used to determine the timing phase of the signal inputted from the input terminal 176.

The skew adjustment section 140 adjusts the skew between the positive phase signal component and the negative phase signal component of the test signal supplied from the waveform shaper 138. The variable delay circuit 142 adjusts the phase of the positive phase signal component. The variable delay circuit 144 adjusts the phase of the negative phase signal component. The skew adjustment section 140 supplies the positive phase signal component and the negative phase signal component having undergone the skew adjustment to the differential driver 150.

The differential driver 150 supplies the positive phase signal component of the test signal supplied from the skew adjustment section 140 to the first output pin 172 that outputs the test signal, via the output resistance 152. The differential driver 150 supplies the negative phase signal component of the test signal supplied from the skew adjustment section 140 to the second output pin 174 that outputs the test signal, via the output resistance 154. The output resistance 152 and the output resistance 154 may have the same resistivity.

One input end of the comparator 162 is connected to the input terminal 176, and the input end receives an output signal from the device under test via the input terminal 176. The interconnection between the input end of the comparator 162 and the input terminal 176 may be coupled to the terminal voltage source via the termination resistance 166. The terminal voltage source applies a voltage $V_{TT}$. The other input end of the comparator 162 may be coupled to a reference voltage source. The reference voltage source applies a voltage $V_{REF}$. The termination resistance 166 may have the same resistivity as the output resistance 152 and the output resistance 154. Note that the terminal voltage source and the reference voltage source are not illustrated in FIG. 1.

The comparator 162 compares the voltage of the output signal supplied by the input terminal 176 and the voltage $V_{REF}$, and supplies the comparison result to the pattern comparator 164. For example, when the voltage of the output signal is lower than $V_{REF}$, the comparator 162 outputs L logic as the comparison result. On the other hand, when the voltage of the output signal is higher than $V_{REF}$, the comparator 162 outputs H logic as the comparison result.

The comparator 162 is able to measure the transition timing of the applied signal. The comparator 162 may measure the transition timing of the output signal of the device under test, based on the strobe signal supplied from the waveform shaper 138.

The pattern comparator 164 compares the expected value signal supplied from the pattern generator 136 with the comparison result supplied from the comparator 162, and determines whether the device under test is defective. Although not shown in FIG. 1, the pattern comparator 164 may supply the test result to the apparatus body 102, for example.

Next, the skew adjustment between output pins in the test apparatus 100 is discussed. An exemplary method to adjust the skew between output pins of the test apparatus 100 is to observe the output signal by directly contacting the output pin to be observed using a probing robot that has a wideband probe linked to the arm of the robot. Note that the probing robot is not illustrated in FIG. 1.

Correction of a skew between output pins using a probing robot can be executed in the following manner, for example. In the following example, the apparatus body 102 includes a plurality of test executing sections 132, and the test executing sections 132 output a differential signal that contains a positive phase signal and a negative phase signal, to correct the skew of differential signals.

The wideband probe is brought in contact with one output pin of the pair of output pins to be corrected, e.g., the first output pin 172, to measure the positive phase signal. When the positive phase signal is transitioned from L logic to H logic for example, the timing at which the positive phase signal starts is measured using a highly accurate timing measurement device. For example, the timing point at which the amplitude is 50% is measured using the highly accurate timing measurement device.

Next, the wideband probe is moved to be brought in contact with the other output pin of the pair of output pins to be corrected, e.g., the second output pin 174, to measure the negative phase signal. Just as the positive phase signal, the highly accurate timing measurement device is used to measure the timing at which the negative phase signal ends. The differential skew is obtained as a difference between the timing point obtained by measuring the first output pin 172 and the timing point obtained by measuring the second output pin 174. The test apparatus 100 adjusts the setting of the skew adjustment section 140 so that the differential skew falls within a predetermined range. Accordingly, the correction of the differential skew between a pair of output pins ends.

After correction of the differential skew between the pair of output pins ends, the wideband probe is moved to correct the differential skew between another pair of output pins. In the similar manner, the correction of a skew between a pair of output pins is repeated until the correction to the entire test apparatus 100 ends.

As described above, use of a probing robot enables to correct the skew between output pins. However, with this method, the measurement time takes long since correction is performed for each pin. In addition, the installation and the operation of the probing robot take time and trouble, which degrades the operability. In the case where the test apparatus 100 outputs a differential signal, since the frequency response characteristic is different between the first output pin 172 and the second output pin 174, the differential skew degrades if a differential signal having a different frequency from the frequency at which correction is performed is outputted. In view of this, a skew adjustment method and a skew adjustment apparatus that can conduct measurement in shorter time and have a favorable operability are desirable, to allow the differential skew to be corrected each time the frequency changes.

The test apparatus 100, including an interconnection substrate 104, is able to provide a skew measurement method and a skew adjustment method that can be performed in short time and with favorable operability. The interconnection substrate 104 may be an example of a skew adjustment apparatus. A signal inputted to the first terminal 112 and the second terminal 114 of the interconnection substrate 104 is short-circuited at the bonding node 116 and outputted from the third terminal 118.

The interconnection substrate 104 may be a substrate such as a print interconnection substrate and a Si substrate provided with a terminal such as the first terminal 112 and an interconnection such as the first interconnection 122, corresponding to the location of the first output pin 172, the second output pin 174, and the input terminal 176 of the apparatus body 102, for example.

In the interconnection substrate 104, the first interconnection 122 and the second interconnection 124 are formed to have the same length as each other, thereby improving the accuracy of the skew measurement. It is preferable that the third interconnection 126 is formed as short as possible so as to restrain the degradation of the waveform. The length of the first interconnection 122 and the second interconnection 124 may be between 1 mm and 2 mm, inclusive, for example. The length of the third interconnection 126 may be between 2 mm and 3 mm, inclusive, for example. Accordingly, there will be a favorable match in frequency characteristic in wideband.

In the present embodiment, the first terminal 112, the second terminal 114, and the bonding node 116 are located form an isosceles triangle or a regular triangle. However, the location of the first terminal 112, the second terminal 114, and the bonding node 116 is not limited as such. The first interconnection 122 and the second interconnection 124 of the interconnection substrate 104 may have the minimum length equal to each other. For example, the bonding node 116 may be formed at the midpoint between the first terminal 112 and the second terminal 114.

In the present specification, the first interconnection 122 and the second interconnection 124 can have substantially the equal length to each other, not limited to exactly the same length as each other. Substantially the equal length means that even if the first interconnection 122 and the second interconnection 124 have different lengths from each other, the difference between the first interconnection 122 and the second interconnection 124 in terms of interconnection delay time is smaller than the allowable error of the skew.

The allowable error of the skew is defined by taking into consideration the operating frequency of a device under test and the accuracy of the skew necessary for testing a device under test. For example, suppose a case where the operating frequency of a device under test is 6.5 GHz and the required accuracy of the skew is in the range of −4 ps and +4 ps. In this case, if the difference between the length of the first interconnection 122 and the length of the second interconnection 124 is within the range of 0.1 mm, the first interconnection 122 and the second interconnection 124 can be said to have substantially the equal length to each other.

By adopting the above configuration, the test apparatus 100 is able to measure the skew between output pins by coupling the apparatus body 102 to the interconnection substrate 104. For example, the test apparatus 100 can measure the differential skew of the differential signal outputted from the first output pin 172 and the second output pin 174. The test apparatus 100 adjusts the setting of the skew adjustment section 140 based on the measured value of the differential skew.

Accordingly, the skew between output pins can be corrected highly accurately, by using the comparator 162 included in the test apparatus 100. In addition, the interconnection substrate 104 can be manufactured very inexpensively compared to a probing robot. Furthermore, even when the test apparatus 100 includes a plurality of pairs of output pins for adjusting the skew, the skew of all the pairs can be simultaneously measured. This contributes to skew correction in short time.

For example, in the test apparatus 100, all the test executing sections 132 include a first output pin 172, a second output pin 174, an input terminal 176, and a comparator 162. Due to this configuration, the test apparatus 100 is able to simultaneously correct the skews for all the test executing sections. Since it is possible to correct skews easily in short time, it is easy to correct the skew each time the frequency of a test signal is changed.

In the present embodiment, the skew adjustment apparatus is an interconnection substrate 104. However, the form of the skew adjustment apparatus is not limited to a substrate form. Desirably, however, the skew adjustment apparatus has the same form as the device under test.

In the present embodiment, the differential skew is measured between the first output pin 172 that outputs the positive phase signal and the second output pin 174 that outputs the negative phase signal. However, the application of the interconnection substrate 104 is not limited to this. By designing the location of the terminal and the interconnection for each measurement target, the interconnection substrate 104 can be used to measure the skew between any output pins in the test apparatus 100.

In the present embodiment, the interconnection substrate 104 does not include a timing measurement circuit, and the comparator 162 of the apparatus body 102 measures the skew between output pins. However, the configuration of the test apparatus 100 is not limited as such. For example, the interconnection substrate 104 may include a timing measurement circuit, so that the test apparatus 100 use the timing measurement circuit to measure the skew between output pins. Accordingly, even when the apparatus body 102 does not include therein a comparator 162, or when the accuracy of the comparator 162 of the apparatus body 102 is low, the skew between output pins is measured with accuracy.

Figure 2:
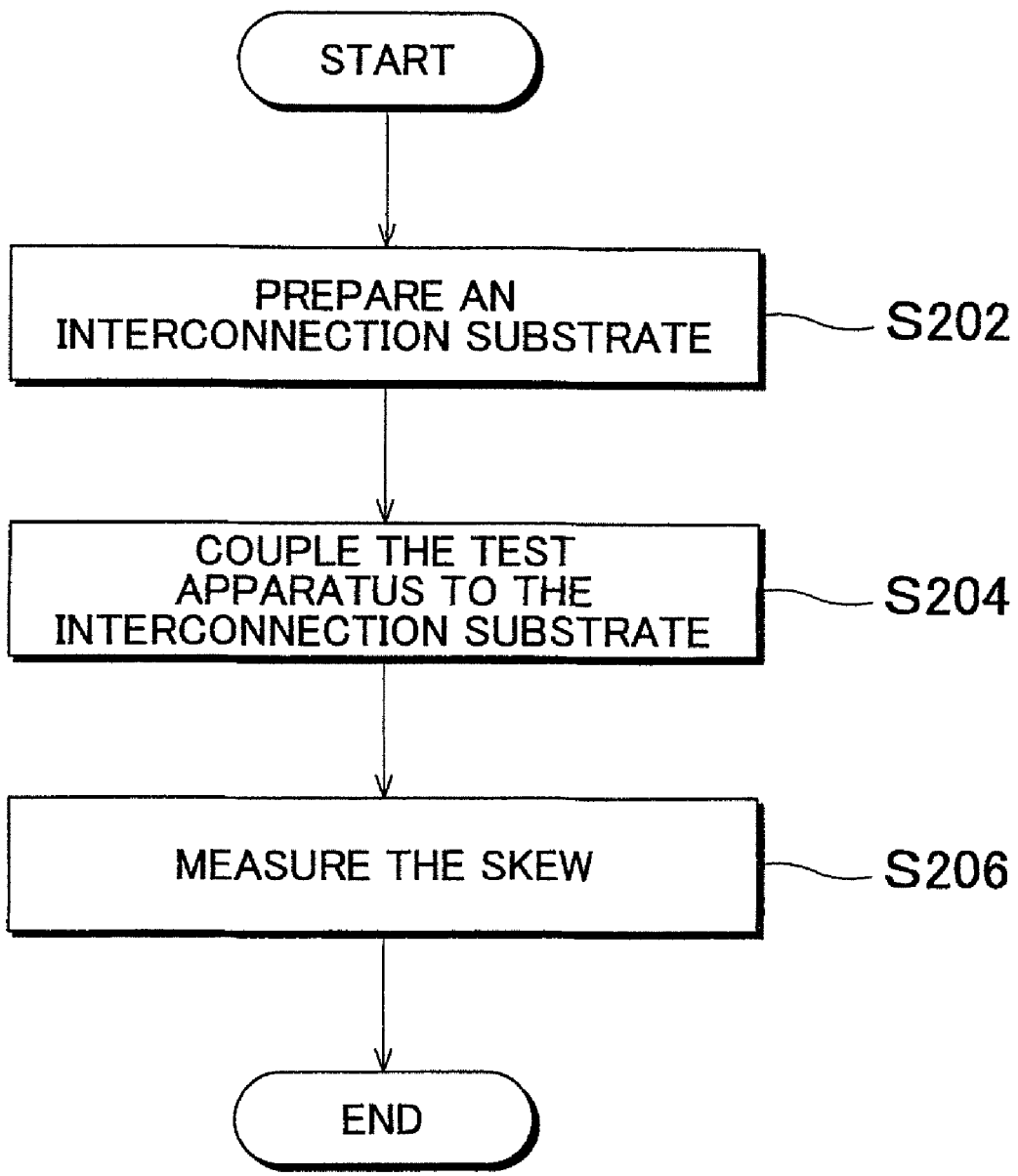
FIG. 2 schematically shows an example of a skew measurement method for measuring the skew between output pins in the test apparatus 100.

FIG. 2 schematically shows an example of a skew measurement method for measuring the skew between output pins in the test apparatus 100. As shown in FIG. 2, the interconnection substrate 104 is prepared in S202. Specifically, the interconnection substrate 104 includes the first terminal 112, the second terminal 114, the first interconnection 122 connecting the first terminal 112 to the bonding node 116, the second interconnection 124 connecting the second terminal 114 to the bonding node 116 and having the length equal to the first interconnection 122, and the third interconnection 126 connecting the bonding node 116 to the output node.

In S204, the test apparatus 10 is coupled to the interconnection substrate 104. Specifically, the first output pin 172 of the test apparatus 100 is coupled to the first terminal 112 of the interconnection substrate 104, and the second output pin 174 of the test apparatus 100 is coupled to the second terminal 114 of the interconnection substrate 104. The input terminal 176 of the test apparatus 100 is coupled to the third terminal 118 of the interconnection substrate 104.

In S206, the skew between the first output pin 172 and the second output pin 174 is measured. The skew can be measured by measuring the voltage at the third terminal 118 relative to the reference voltage $V_{REF}$. The test apparatus 100 may adjust the setting of the skew adjustment section 140 so that the value of the skew falls within a predetermined range based on the measured value of the skew.

FIG. 3 schematically shows an example of a method of measuring the skew of the test apparatus 100 explained with reference to S206 in FIG. 2. As shown in FIG. 3, in the step of measuring a skew in S206, first in S302, the first timing representing the transition timing of a signal obtained by outputting the test signal from the first output pin is measured. The first timing is measured as in the following step.

Specifically, the first output pin 172 is used to output a test signal while maintaining the second output pin 174 to a high level or a low level. The voltage of the third terminal 118 of the interconnection substrate 104 is inputted to one input end of the comparator 162 via the input terminal 176.

The first reference voltage determined based on the relation between the level of the second output pin 174 and the transition state of the test signal is inputted to the other input end of the comparator 162. The timing at which the voltage of the third terminal 118 matches the first reference voltage is measured as the first timing, using the strobe signal supplied from the waveform shaper 138.

In S304, the second timing representing the transition timing of the signal obtained by outputting a test signal from the second output pin is measured. The second timing is measured as in the following manner, for example.

Specifically, the test signal is outputted from the second output pin 174 while maintaining the first output pin 172 to a high level or a low level. The voltage of the third terminal 118 of the interconnection substrate 104 is inputted to one input end of the comparator 162 via the input terminal 176.

The second reference voltage determined based on the relation between the level of the first output pin 172 and the transition state of the test signal is inputted to the other input end of the comparator 162. The timing at which the voltage of the third terminal 118 matches the second reference voltage is measured as the second timing, using the strobe signal supplied from the waveform shaper 138.

In S306, the skew between the first output pin 172 and the second output pin 174 is measured. The skew is obtained from the difference between the first timing and the second timing.

Figure 4:
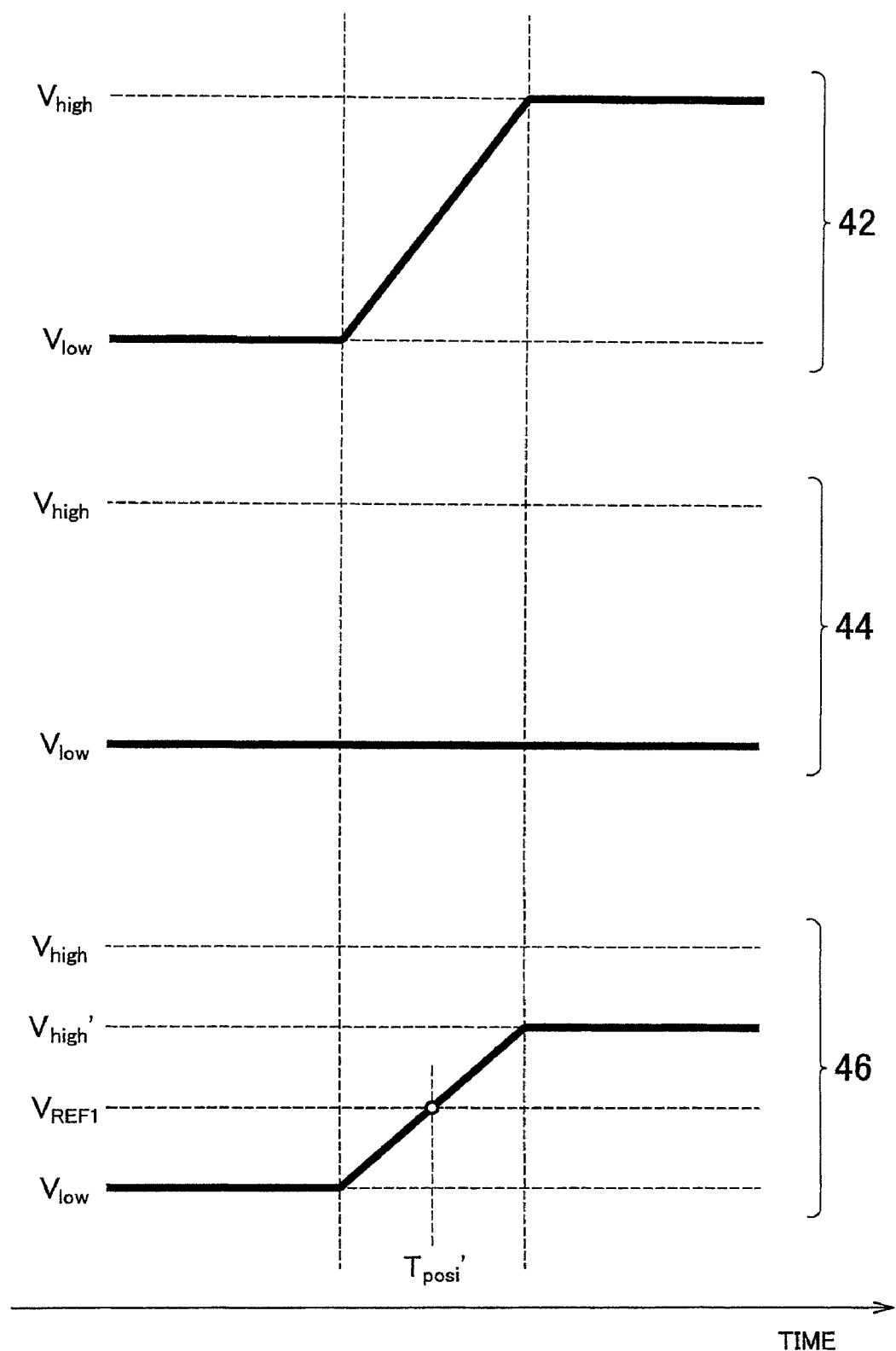
FIG. 4 schematically shows an example of the measurement process at the first timing shown in FIG. 3.

FIG. 4 schematically shows an example of the measurement process at the first timing shown in FIG. 3. The solid lines of FIG. 4 represent the output 42 of the first output pin 172, the output 44 of the second output pin 174, and the voltage 46 of the third terminal 118 inputted to the comparator 162.

In FIG. 4, the voltage of the output 42 and the output 44 is represented as a voltage under a condition where the interconnection substrate 104 is not connected to the first output pin 172 and the second output pin 174, i.e., the voltage at the open end. Also in FIG. 4, the output resistance 152, the output resistance 154, and the termination resistance 166 have the same resistivity as each other, and $V_{low}$ is applied as the voltage $V_{TT}$.

As shown in FIG. 4, the first output pin 172 outputs a test signal transitioning from low level $V_{low}$ to high level $V_{high}$. Meanwhile, the output 44 of the second output pin 174 is maintained to low level $V_{low}$, and the voltage 46 is inputted to one input end of the comparator 162. The value of the voltage 46 is transitioned from $V_{low}$ to $V_{high}'$. The other input end of the comparator 162 is provided with the first reference voltage $V_{REF1}$. The first timing $T_{posi}'$ is measured as a timing at which the voltage 46 matches the first reference voltage $V_{REF1}$.

50% of the input amplitude is set as the value of the first reference voltage $V_{REF1}$, for example. The value of the first reference voltage $V_{REF1}$ is represented as in the below expression 1. For example, when $V_{high}$ is 1V and $V_{low}$ is 0V, $V_{high}'$ is divided into ⅓V, and $V_{REF1}$ is ⅙V.

$$V_{REF1}=(V_{high}'-V_{low})/2 \qquad \text{Expression 1}$$

Figure 5:
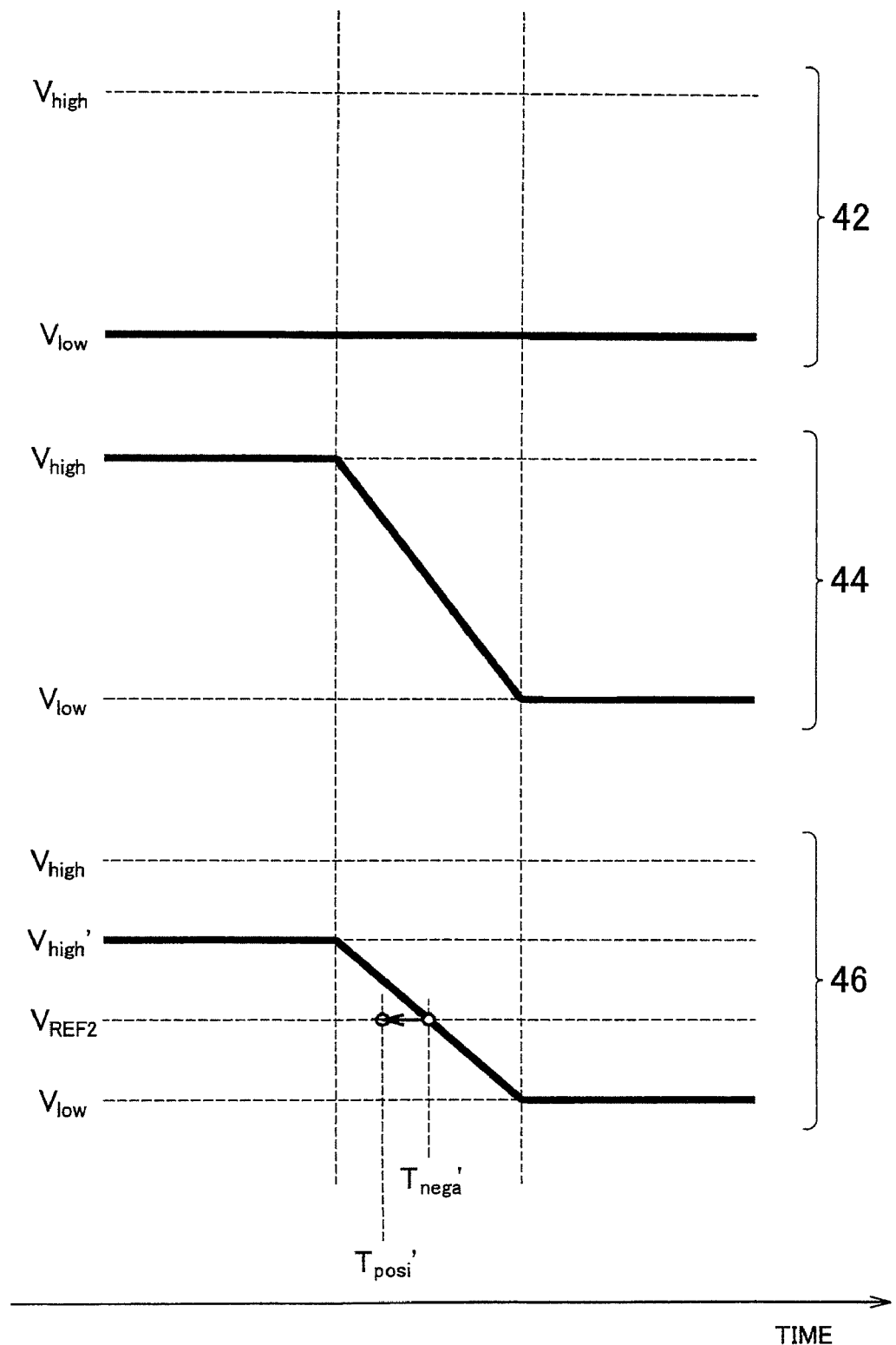
FIG. 5 schematically shows an example of the measurement process at the second timing shown in FIG. 3.

FIG. 5 schematically shows an example of the measurement process at the second timing shown in FIG. 3. The solid lines of FIG. 5 show the output 42 of the first output pin 172, the output 44 of the second output pin 174, and the voltage 46 of the third terminal 118 inputted to the comparator 162.

In FIG. 5, the voltage of the output 42 and the output 44 is represented as a voltage under a condition where the interconnection substrate 104 is not connected to the first output pin 172 and the second output pin 174, i.e., the voltage at the open end. Also in FIG. 5, the output resistance 152, the output resistance 154, and the termination resistance 166 have the same resistivity as each other, and $V_{low}$ is applied as the voltage $V_{TT}$.

As shown in FIG. 5, the second output pin 174 outputs a test signal transitioning from high level $V_{high}$ to low level $V_{low}$. Meanwhile, the output 42 of the first output pin 172 is maintained to low level $V_{low}$, and the voltage 46 is inputted to one input end of the comparator 162. The value of the voltage 46 is transitioned from $V_{high}'$ to $V_{low}'$. The other input end of the comparator 162 is provided with the second reference voltage $V_{REF2}$. The second timing $T_{nega}'$ is measured as a timing at which the voltage 46 matches the second reference voltage $V_{REF2}$. 50% of the input amplitude is set as the value of the second reference voltage $V_{REF2}$.

The test apparatus 100 may adjust the setting of the skew adjustment section 140 so that the difference between the first timing $T_{posi}'$ and the second timing $T_{nega}'$ falls within a predetermined range. The test apparatus 100 may adjust the setting of the skew adjustment section 140 so that the first timing $T_{posi}'$ is equal to the second timing $T_{nega}'$.

Figure 6:
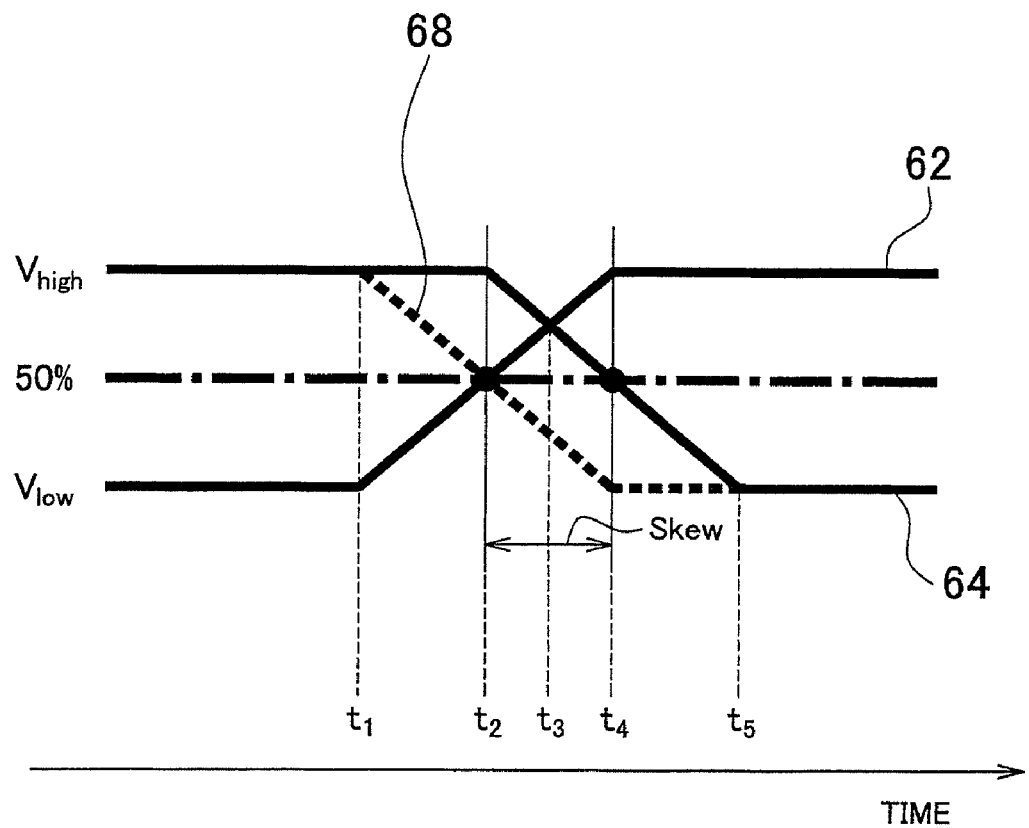
FIG. 6 schematically shows another example of measuring the skew of the test apparatus 100.
Figure 7:
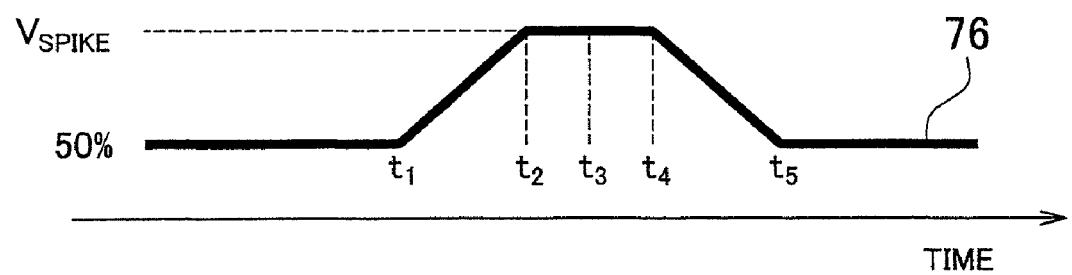
FIG. 7 schematically shows an example of a spike voltage at a third terminal 118 shown in FIG. 6.

FIG. 6 schematically shows another example of measuring the skew of the test apparatus 100. FIG. 7 schematically shows an example of a spike voltage at a third terminal 118 shown in FIG. 6. With reference to FIG. 6 and FIG. 7, the following describes the skew measurement method as well as the skew correction method using the value of the spike voltage 76 occurring to the third terminal 118 when the first output pin 172 outputs a positive phase signal 62 of the test signal and the second output pin 174 outputs the negative phase signal 64 of the test signal.

As shown in FIG. 6, the positive phase signal 62 transitions from low level $V_{low}$ to high level $V_{high}$ from time $t_1$ to time $t_4$. On the other hand, the negative phase signal 64 has a skew, and transitions from high level $V_{high}$ to low level $V_{low}$ from time $t_2$ to time $t_5$.

The transition timing of the positive phase signal 62 and the negative phase signal 64 can be measured using the value of 50% of the input amplitude, for example. In FIG. 6, the transition timing of the positive phase signal 62 is $t_2$, and the transition timing of the negative phase signal 64 is $t_4$. The skew is obtained as the difference between $t_4$ and $t_2$. Note that in FIG. 6, the dotted line 68 represents the negative phase signal when there is no skew. Time $t_3$ represents a time at which the positive phase signal 62 intersects the negative phase signal 64.

As shown in FIG. 7, when the positive phase signal 62 is inputted from the first output pin 172 to the interconnection substrate 104, and the negative phase signal 64 is outputted from the second output pin 174, the spike voltage 76 appears at the third terminal 118 of the interconnection substrate 104. The value of the spike voltage 76 is the value of 50% of the input amplitude until time $t_1$. After time $t_1$, the value of the spike voltage 76 gradually increases, and indicates a substantially constant value $V_{SPIKE}$ from time $t_2$ to time $t_4$. After time $t_4$, the value of the spike voltage 76 gradually decreases, and at time $t_5$, the value returns to 50% of the input amplitude. The skew can be measured by measuring the time during which the spike voltage 76 indicates the substantially constant value $V_{SPIKE}$.

The test apparatus 100 may adjust the setting of the skew adjustment section 140 so that the spike voltage 76 is equal to or falls below a certain value. The test apparatus 100 may adjust the setting of the skew adjustment section 140 so that the time during which there is a spike voltage is equal to or falls below a certain value.

Figure 8:
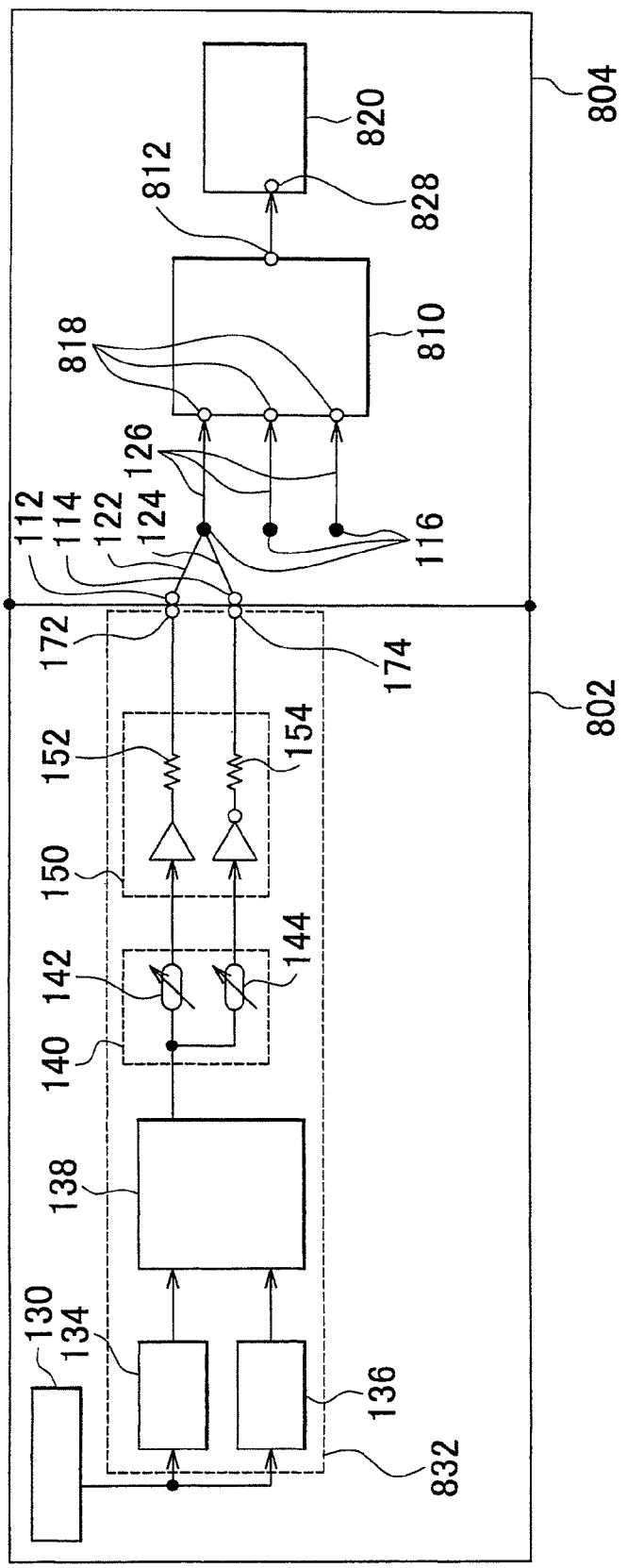
FIG. 8 schematically shows an example of the configuration of a test apparatus 800 that includes an interconnection substrate 804 according to another embodiment.

FIG. 8 schematically shows an example of the configuration of a test apparatus 800 that includes an interconnection substrate 804 according to another embodiment. The test apparatus 800 includes an apparatus body 802 and an interconnection substrate 804, and has substantially the same configuration as the test apparatus 100. The apparatus body 802 has substantially the same configuration as the apparatus body 102. The interconnection substrate 804 has substantially the same configuration as the interconnection substrate 104. As follows, the test apparatus 800, the apparatus body 802, and the interconnection substrate 804 may not be explained in detail except for the differences between the test apparatus 100, the apparatus body 102, and the interconnection substrate 104.

The apparatus body 802 includes a reference clock generator 130 and a plurality of test executing sections 832. One test executing section 832 includes a timing generator 134, a pattern generator 136, a waveform shaper 138, a skew adjustment section 140, a differential driver 150, a first output pin 172, and a second output pin 174. The skew adjustment section 140 includes a variable delay circuit 142 and a variable delay circuit 144. The differential driver 150 includes an output resistance 152 and an output resistance 154. Note that FIG. 8 shows only one test executing section 832 in the apparatus body 802.

The interconnection substrate 804 includes, for each of the plurality of test executing sections 832, a first terminal 112, a second terminal 114, a bonding node 116, a first interconnection 122, and a second interconnection 124. The interconnection substrate 804 is different from the interconnection substrate 104 in that it includes a multiplexer 810 and a wideband comparator circuit 820. The wideband comparator circuit 820 may be an example of a timing measurement circuit.

The multiplexer 810 includes an output terminal 812 and a plurality of input terminals 818. The input terminals 818 of the multiplexer 810 may be an example of an output node. Each of the input terminals 818 is connected to a bonding node 116 of a corresponding one of the plurality of test executing sections 832. The multiplexer 810 selects a signal to be outputted, from among the signals inputted to the plurality of input terminals 818, and supplies the selected signal to the wideband comparator circuit 820.

The interconnection substrate 804 is different from the interconnection substrate 104 in that the third interconnection 126 connects the bonding node 116 and the input terminal 818 of the multiplexer 810. Note that FIG. 8 does not show how the plurality of test executing sections 832 are connected to the plurality of bonding nodes 116.

The wideband comparator circuit 820 corresponds to the comparator 162 of the test apparatus 100. The wideband comparator circuit 820 measures the transition timing of the signal supplied from the multiplexer 810. In the present embodiment, the interconnection substrate 804 employs an input terminal 818 of the multiplexer 810 as the output node, instead of the third terminal 118. However, the present invention is not limited to such a configuration. For example, the output node may be an input node 828 of the wideband comparator circuit 820.

By adopting the above-described configuration, the test apparatus 800 is able to measure the skew between the output pins, even when there is no comparator in the apparatus body 802. In addition, even when the accuracy of the comparator in the apparatus body 802 is low, the test apparatus 800 is able to measure the skew between output pins with accuracy, by incorporating the wideband comparator circuit 820 having higher accuracy than the comparator, into the interconnection substrate 804.

Although some aspects of the present invention have been described by way of exemplary embodiments, it should be understood that those skilled in the art might make many changes and substitutions without departing from the spirit and the scope of the present invention which is defined only by the appended claims.

The operations, the processes, the steps, or the like in the apparatus, the system, the program, and the method described in the claims, the specification, and the drawings are not necessarily performed in the described order. The operations, the processes, the steps, or the like can be performed in an arbitrary order, unless the output of the former-described processing is used in the later processing. Even when expressions such as "First," or "Next," or the like are used to explain the operational flow in the claims, the specification, or the drawings, they are intended to facilitate the understanding of the invention, and are never intended to show that the described order is mandatory.

As clear from the foregoing, one embodiment of the present invention realizes an interconnection substrate, a skew measurement method, and a test apparatus, by which the skew between output pins in a test apparatus is easily measured.

The invention claimed is:

1. An interconnection substrate used in skew adjustment between output pins in a test apparatus, the test apparatus supplying a test signal to a device under test to test the device under test, the interconnection substrate comprising:
   a first terminal coupled to a first output pin that outputs the test signal;
   a second terminal coupled to a second output pin that outputs the test signal;
   a first interconnection connecting the first terminal to a bonding node;
   a second interconnection connecting the second terminal to the bonding node; and
   a third interconnection connecting the bonding node to an output node, wherein
   the first interconnection and the second interconnection have a length equal to each other.

2. The interconnection substrate according to claim 1, wherein
   the length of the first interconnection and the second interconnection is the minimum.

3. The interconnection substrate according to claim 1, wherein
   the test apparatus includes an input terminal connected to a timing measurement circuit operable to measure a transition timing of an applied signal, and
   the output node is a third terminal coupled to the input terminal.

4. The interconnection substrate according to claim 1, further comprising:
   a timing measurement circuit operable to measure a transition timing of an applied signal, wherein
   the output node is an input node of the timing measurement circuit.

5. The interconnection substrate according to claim 1, wherein
   the test signal outputted from the first output pin is a positive phase signal, and the test signal outputted from the second output pin is a negative phase signal.

6. A skew measurement method for measuring a skew between output pins in a test apparatus, the test apparatus supplying a test signal to a device under test to test the device under test, the skew measurement method comprising:
   preparing an interconnection substrate that includes a first terminal, a second terminal, a first interconnection connecting the first terminal to a bonding node, a second interconnection connecting the second terminal to the bonding node and having a length equal to the first interconnection, and a third interconnection connecting the bonding node to an output node;
   coupling a first output pin of the test apparatus to the first terminal of the interconnection substrate, where the first output pin outputs the test signal, and coupling a second output pin of the test apparatus to the second terminal of the interconnection substrate, where the second output pin outputs the test signal; and
   measuring a skew between the first output pin and the second output pin by measuring a voltage of the output node relative to a reference voltage.

7. The skew measurement method according to claim 6, wherein
   the measuring a skew includes:
   outputting the test signal from the first output pin while maintaining the second output pin to either a high level or a low level, and measuring a first timing at which the voltage of the output node matches a first reference voltage, where the first reference voltage is determined based on a relation between a level of the second output pin and a transition state of the test signal;
   outputting the test signal from the second output pin while maintaining the first output pin to either a high level or a low level, and measuring a second timing at which the voltage of the output node matches a second reference voltage, where the second reference voltage is determined based on a relation between a level of the first output pin and the transition state of the test signal; and measuring the skew from a difference between the first timing and the second timing.

8. The skew measurement method according to claim 6, wherein
the first output pin outputs a positive phase signal of the test signal, and the second output pin outputs a negative phase signal of the test signal, and
the measuring a skew includes measuring the skew using a value of a spike voltage occurring at the output node.

9. A test apparatus for supplying a test signal to a device under test to test the device under test, the test apparatus comprising:
a first output pin and a second output pin that output the test signal;
a timing measurement circuit operable to measure a timing of an applied signal; and
an interconnection substrate including:
a first terminal coupled to the first output pin, a second terminal coupled to the second output pin, a first interconnection connecting the first terminal to a bonding node, a second interconnection connecting the second terminal to the bonding node and having a length equal to the first interconnection, and a third interconnection connecting the bonding node to an output node that is coupled to an input of the timing measurement circuit.

* * * * *